(12) United States Patent
Shin et al.

(10) Patent No.: US 7,650,537 B2
(45) Date of Patent: Jan. 19, 2010

(54) INSPECTION SUPPORT APPARATUS AND INSPECTION SUPPORT METHOD

(75) Inventors: Takao Shin, Yokohama (JP); Shunya Kuwano, Yokohama (JP)

(73) Assignees: Fujitsu Microelectronics Limited, Tokyo (JP); Fujitsu Devices Inc., Tokyo (JP)

( * ) Notice: Subject to any disclaimer, the term of this patent is extended or adjusted under 35 U.S.C. 154(b) by 405 days.

(21) Appl. No.: 11/639,279

(22) Filed: Dec. 15, 2006

(65) Prior Publication Data

US 2008/0126821 A1 May 29, 2008

(30) Foreign Application Priority Data

Jul. 27, 2006 (JP) ............................. 2006-205400

(51) Int. Cl.
*G06F 11/00* (2006.01)
(52) U.S. Cl. .............................. 714/30; 714/31; 714/34
(58) Field of Classification Search .................. 714/30, 714/31, 34
See application file for complete search history.

(56) References Cited

U.S. PATENT DOCUMENTS

| | | | | |
|---|---|---|---|---|
| 5,864,564 A | * | 1/1999 | Levitt et al. ................. | 714/731 |
| 6,943,590 B2 | * | 9/2005 | Kitahara ....................... | 327/18 |
| 6,948,098 B2 | * | 9/2005 | Pillay et al. .................... | 714/34 |
| 7,093,153 B1 | * | 8/2006 | Witek et al. .................. | 713/600 |
| 7,131,035 B2 | * | 10/2006 | Gulick et al. .................. | 714/34 |
| 7,434,106 B2 | * | 10/2008 | Miller .......................... | 714/43 |
| 2003/0110407 A1 | * | 6/2003 | Maeda ........................ | 713/500 |
| 2004/0216005 A1 | * | 10/2004 | Pramanick et al. ............ | 714/30 |
| 2006/0206763 A1 | * | 9/2006 | Kudo ........................... | 714/30 |
| 2006/0248436 A1 | * | 11/2006 | LaFrance-Linden ........ | 714/822 |

FOREIGN PATENT DOCUMENTS

JP     2001-92692     4/2001

* cited by examiner

*Primary Examiner*—Marc Duncan
(74) *Attorney, Agent, or Firm*—Arent Fox LLP (57) ABSTRACT

To enable measurement of a suspension position and a suspension period of the reference clock of a microcomputer to be inspected, based on the information stored into a clock information register section, by acquiring output data output from the microcomputer; preserving the acquired output data into a data bank section by use of the reference clock being output from the microcomputer together with the output data; discriminating the suspension of the reference clock by a clock operation discrimination section at sampling intervals of the output data; and writing and preserving the discrimination result into the clock information register section by a register control section.

15 Claims, 10 Drawing Sheets

|  | T61 | | | | | | | | | | | | | | | | T62 |
|---|---|---|---|---|---|---|---|---|---|---|---|---|---|---|---|---|---|
|  | ↓0 | 1 | 2 | 3 | 4 | 5 | 6 | 7 | 8 | 9 | A | B | C | D | E | F↓ |
| REG-A/B | 0 | 0 | 0 | 0 | 0 | 0 | 0 | 0 | 0 | 0 | 0 | 0 | 0 | 0 | 0 | 0 |
| DTB-A/B | ND | ND | ND | ND | ND | ND | ND | ND | ND | ND | ND | ND | ND | ND | ND | ND |

FIG. 6B

|  | T63 | | | | | | | | | | T64 | | | | | T65 |
|---|---|---|---|---|---|---|---|---|---|---|---|---|---|---|---|---|
|  | ↓0 | 1 | 2 | 3 | 4 | 5 | 6 | 7 | 8 | 9 | ↓A | B | C | D | E | F↓ |
| REG-A/B | 0 | 0 | 0 | 0 | 0 | 0 | 0 | 0 | 0 | 0 | 1 | 1 | 1 | 1 | 1 | 1 |
| DTB-A/B | ND | ND | ND | ND | ND | ND | ND | ND | ND | ND | OD | OD | OD | OD | OD | OD |

FIG. 6C

|  | T66 | | | | | | | | | | | | | | | T67 |
|---|---|---|---|---|---|---|---|---|---|---|---|---|---|---|---|---|
|  | ↓0 | 1 | 2 | 3 | 4 | 5 | 6 | 7 | 8 | 9 | A | B | C | D | E | F↓ |
| REG-A/B | 1 | 1 | 1 | 1 | 1 | 1 | 1 | 1 | 1 | 1 | 1 | 1 | 1 | 1 | 1 | 1 |
| DTB-A/B | OD | OD | OD | OD | OD | OD | OD | OD | OD | OD | OD | OD | OD | OD | OD | OD |

FIG. 6D

|  | T68 | | | | | T69 | | | | | | | | | | T70 |
|---|---|---|---|---|---|---|---|---|---|---|---|---|---|---|---|---|
|  | ↓0 | 1 | 2 | 3 | 4 | ↓5 | 6 | 7 | 8 | 9 | A | B | C | D | E | F↓ |
| REG-A/B | 1 | 1 | 1 | 1 | 1 | 0 | 0 | 0 | 0 | 0 | 0 | 0 | 0 | 0 | 0 | 0 |
| DTB-A/B | ND | ND | ND | ND | ND | ND | ND | ND | ND | ND | ND | OD | OD | OD | OD | OD |

|  | 0 | 1 | 2 | 3 |
|---|---|---|---|---|
| REGISTER | 1 | 1 | 0 | 0 |
| DATA BANK | A | B | C | D |

FIG. 8B

| CLOCK SUSPENDED | CLOCK SUSPENDED | A | B |
|---|---|---|---|
| NIL | NIL | 2 | 0 |

INSPECTION SUPPORT APPARATUS AND INSPECTION SUPPORT METHOD

CROSS-REFERENCE TO RELATED APPLICATIONS

This application is based upon and claims the benefit of priority from the prior Japanese Patent Application No. 2006-205400, filed on Jul. 27, 2006, the entire contents of which are incorporated herein by reference.

BACKGROUND OF THE INVENTION

1. Field of the Invention

The present invention relates to an inspection support apparatus and an inspection support method, and more specifically to an inspection support apparatus and an inspection support method suitable for use in a debugging system for inspecting a system employing a microcomputer.

2. Description of the Related Art

When debugging a system employing a microcomputer, a variety of data output from the microcomputer is monitored by a monitoring unit so as to confirm the operating state of the microcomputer. For example, to confirm a program execution state performing a data access to a particular address by means of the microcomputer, the monitoring unit monitors an access state to the particular address using a data passing through a data bus of the microcomputer, a trace data output from the microcomputer, etc., so as to confirm whether or not the data access intended by the program is actually performed.

In particular, to detect a trouble which may occur with extremely low frequency, there is a frequently used debugging method such as executing a program for a long time, and monitoring data continuously during the program execution. In this case, since the acquired amount of the monitored data becomes large in proportion to the measurement time, processing for restricting the data amount is also performed by acquiring the monitored data at appropriate sampling intervals.

However, the microcomputer executes an arithmetic operation and a data access based on an internal reference clock. Therefore, on the occurrence of a state such as suspending of the reference clock in the microcomputer (for example, reset state, stop state, power off state, etc.), it becomes impossible to acquire information to be monitored, because there is no data output from the microcomputer.

As a result, in the conventional monitoring unit, there has been a problem such that, when it is intended to monitor data in regard to a program execution for a time duration internally containing a period such as a state of suspension of the reference clock of the microcomputer, the monitored data acquired from the microcomputer only before and after the above reference clock suspension period is not sufficient for acquiring data for a net measurement time, because no monitored data exists during the clock suspension. Also, there has been another problem such that, because the reference clock suspension of the microcomputer is not preserved as the monitored data, it is not possible to identify a reference clock suspension point by analyzing the monitored data acquired above, in the monitoring unit in which the reference clock suspension state of the microcomputer is not taken into consideration.

Further, in the patent document 1 shown below, in an in-circuit emulator, there has been disclosed a time measurement circuit and a time measurement method for measuring the execution time of a target program to be emulated, and for preserving the measured execution time correspondingly to a traced data.

[Patent document 1] Japanese Patent Application Laid-open No. 2001-92692

SUMMARY OF THE INVENTION

It is an object of the present invention to enable identifying suspension of a reference clock of a microcomputer when debugging a system employing the microcomputer, and to enable measuring the reference clock suspension period.

An inspection support apparatus according to the present invention includes a data acquisition section for acquiring output data being output from a processing circuit to be inspected, and for preserving the output data in a data bank; an operation discrimination section for discriminating the suspension of a reference clock being output from the processing circuit; and a clock information register. The suspension of the reference clock is discriminated in the operation discrimination section at the sampling intervals of the output data, and the discrimination result is preserved in the clock information register.

DETAILED DESCRIPTION OF THE PREFERRED EMBODIMENTS

Hereinafter, an embodiment of the present invention is described based on the drawings.

Figure 1:
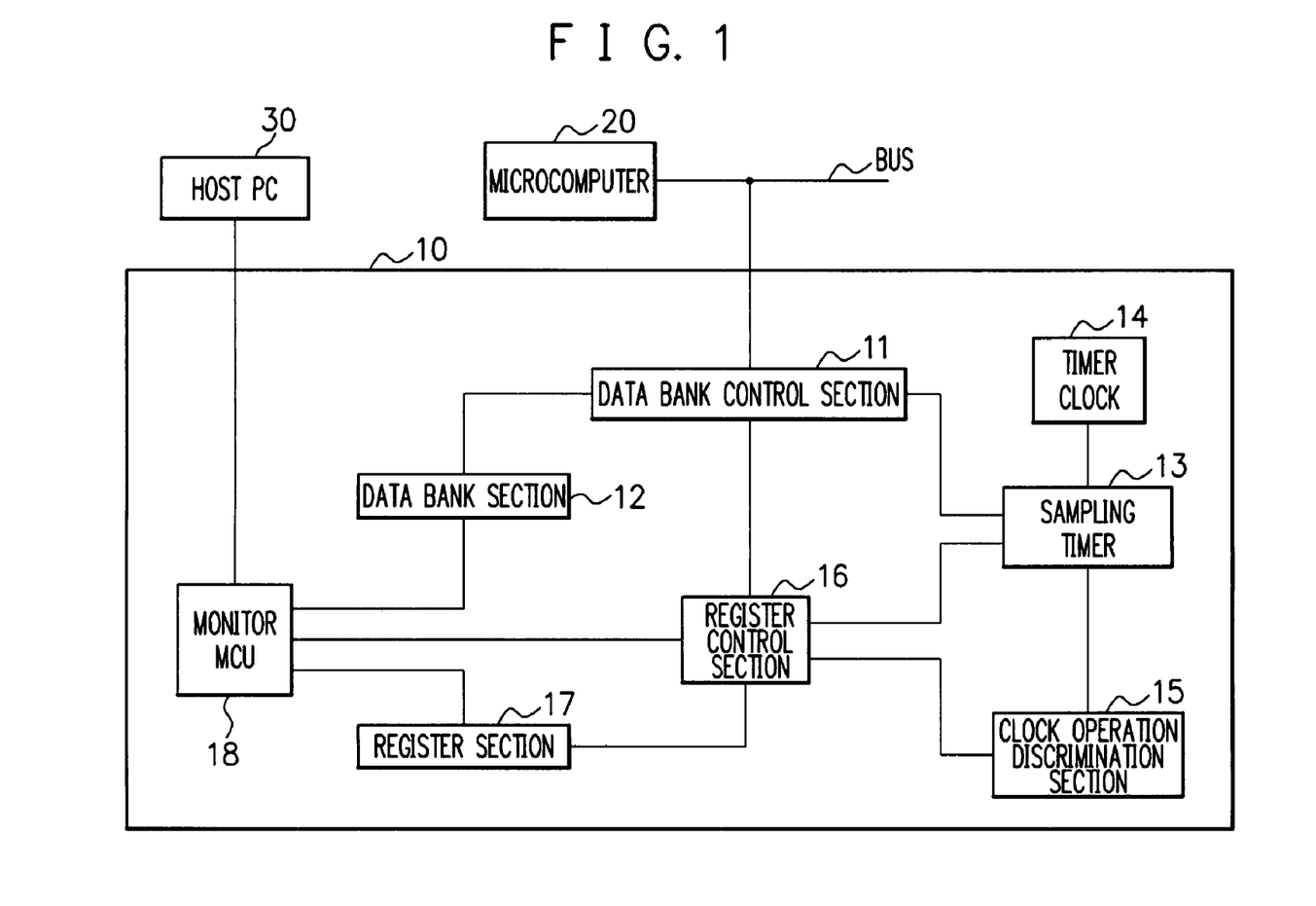
FIG. 1 is a diagram showing a configuration example of a debugging system according to an embodiment of the present invention.

FIG. 1 is a block diagram showing a configuration example of a debugging system to which an inspection support apparatus according to an embodiment of the present invention is applied.

In FIG. 1, a reference numeral 10 is a monitoring unit, a reference numeral 20 is a microcomputer to be inspected (debugged), and a reference numeral 30 is a host computer (host PC). The monitoring unit 10 includes a data bank control section 11, a data bank section 12, a sampling timer 13, a timer clock 14, a clock operation discrimination section 15, a register control section 16, a clock information register section 17 and a monitor MCU (microcomputer unit) 18. The microcomputer 20 executes a program related to the debugging.

The monitoring unit 10 acquires a variety of data being output from the microcomputer 20 via a data bus BUS at appropriate sampling intervals, so as to preserve in the data bank section 12. Typically, the data bank control section 11 receives a sampling request signal being output from the sampling timer 13, and acquires the data output from the microcomputer 20 in response to the sampling request signal, and preserves the acquired data in the data bank section 12. The sampling timer 13 outputs (asserts) the sampling request signal at predetermined sampling intervals using a clock supplied from the timer clock 14. Also, on completion of the data preservation, the sampling timer 13 suspends (negates) the output of the sampling request signal.

Then, when the data amount preserved in the data bank section 12 reaches a predetermined data amount (according to the present embodiment, when data write into the clock information register section 17 described later is completed), the monitor MCU 18 reads out data from the data bank section 12, and outputs the data to the host PC 30. The host PC 30 preserves the data supplied from the monitoring unit 10 in an internal preservation area of the host PC 30, such as a hard disk. By performing a series of the aforementioned operation repeatedly, the data output from the microcomputer 20 is monitored.

Here, at the time of the data output, the microcomputer 20 outputs a reference clock together with the data. The monitoring unit 10 performs operation including the preservation of the acquired data into the data bank section 12, according to the reference clock being output from the microcomputer 20.

The clock operation discrimination section 15 discriminates the state of the reference clock of the microcomputer 20. Namely, the clock operation discrimination section 15 discriminates suspension of the reference clock of the microcomputer 20. On receiving the discrimination result in the clock operation discrimination section 15, the register control section 16 writes a value corresponding to the discrimination result into the clock information register section 17. The decision of the suspension of the reference clock performed in the clock operation discrimination section 15 is made on the basis of each sampling interval for acquiring data, and writing data (values indicating the state of the reference clock) into the clock information register section 17 is performed at the intervals identical to the sampling intervals. Additionally, the clock information register section 17 has a configuration corresponding to the data bank section 12, having the number of bits equal to the number of words storable in the data bank section 12.

As described above, the monitoring unit 10 performs preservation operation of the acquired data according to the reference clock being output from the microcomputer 20. Therefore, when the internal clock of the microcomputer 20 is suspended due to a state shift of the microcomputer 20 into a reset state or a stop state, the reference clock output from the microcomputer 20 is suspended also. As a result, the data preservation into the data bank section 12 is not carried out even when a sampling request signal is output from the sampling timer 13.

Figure 2:
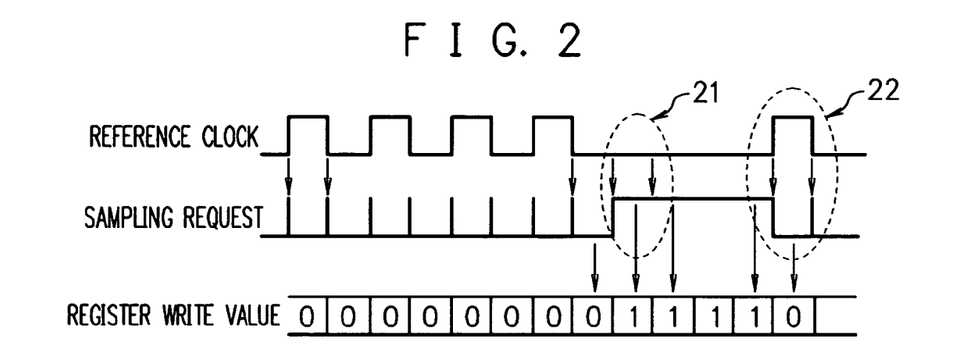
FIG. 2 is a chart for explaining write operation to a clock information register section.

Now, according to the present embodiment, by the use of the sampling request signal, the clock operation discrimination section 15 detects the suspension of the reference clock of the microcomputer 20. Specifically, as shown in FIG. 2, when the reference clock output from the microcomputer 20 is suspended, the sampling request signal remains to be output because the data preservation into the data bank section 12 is not performed even when the sampling request signal is output (refer to a broken line portion 21 shown in FIG. 2). When the sampling request signal continues to be output for a certain time, the clock operation discrimination section 15 decides that the reference clock of the microcomputer 20 has been suspended, and outputs a clock suspension signal to the register control section 16 accordingly. On receipt of the clock suspension signal, the register control section 16 writes a value ("1" in the present embodiment), which indicates the suspension of the reference clock of the microcomputer 20, into the clock information register section 17. On the other hand, when the reference clock is being output from the microcomputer 20, the register control section 16 writes a value ("0" in the present embodiment), which indicates no suspension of the reference clock of the microcomputer 20, into the clock information register section 17.

Additionally, as shown by the broken line portion 22 in FIG. 2, in case that the reference clock output is resumed after the suspension of the reference clock output from the microcomputer 20, from the fact of the sampling request signal being negated, the clock operation discrimination section 15 decides that the reference clock is being output from the microcomputer 20. Accordingly, the register control section 16 writes a value "0" into the clock information register section 17.

Then, when the register control section 16 completes writing the entire values into the clock information register section 17, that is, when writing the entire data into the clock information register section 17 is completed, the monitor MCU 18 reads out the data from the data bank section 12, and also reads out the register values in the clock information register section 17, so as to output to the host PC 30. The host PC 30 then preserves the data and the register values supplied from the monitoring unit 10 into an internal preservation area of the host PC 30, such as a hard disk.

Figure 3A:
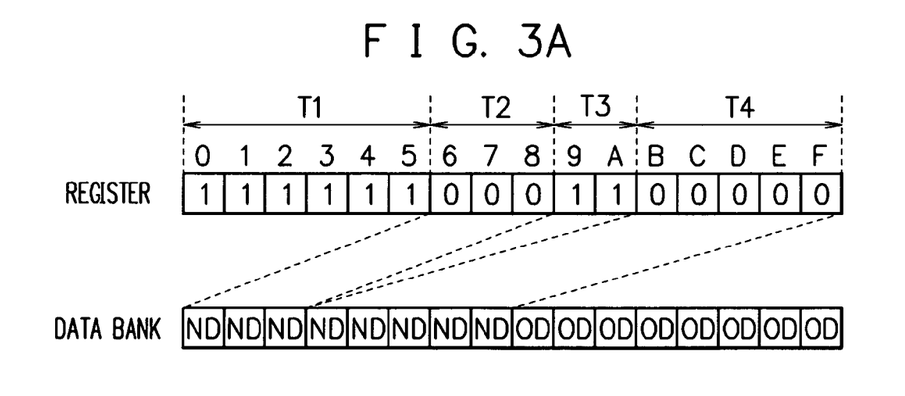
FIGS. 3A and 3B are diagrams showing the correspondence between the clock information register section and a data bank section.

Next, the correspondence of the clock information register section 17 to the data bank section 12 will be described referring to FIGS. 3A and 3B. FIG. 3A is diagram showing the correspondence between the clock information register section 17 and the data bank section 12 before analysis, that is, in an intact state of data being preserved at the time of measurement. Meanwhile, FIG. 3B is diagram showing the correspondence between the clock information register section 17 and the data bank section 12 after the analysis.

Figure 3B:
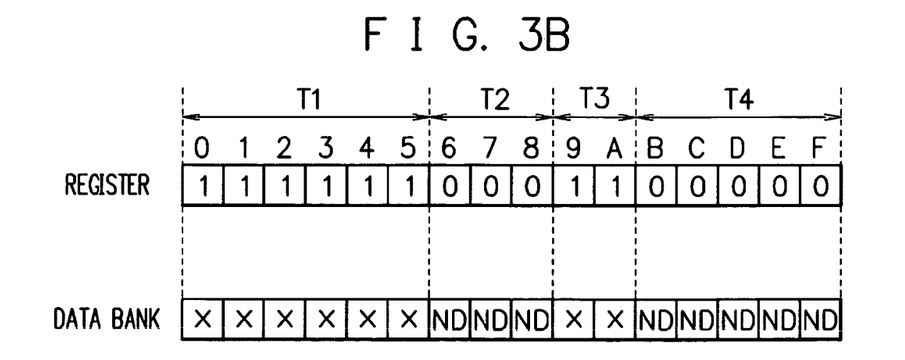

Here, in FIGS. 3A and 3B, it is assumed that the clock information register section 17 has a 16-bit structure, and that the data bank section 12 can store 16-word data (for the convenience of explanation, the figures are shown with a hexadecimal notation.). Also, as described above, the write timing to the clock information register section 17 is identical to the sampling interval. To each bit, it is assumed that "1" is written when the suspension of the reference clock of the microcomputer 20 has been detected in the corresponding sampling period, and that "0" is written when the suspension of the reference clock is not detected. Also, "ND" indicates a data newly written, while "OD" indicates an old data having been sampled and already been read out by the monitor MCU.

As shown in FIG. 3A, in a period T1 in which the clock operation discrimination section 15 decides that the reference clock of the microcomputer 20 has been suspended, "1" is written into each bit corresponding to the period T1, namely, the 0th bit through the fifth bit, of the clock information register section 17, and no data is written into the data bank section 12. In a successive period T2, when the clock operation discrimination section 15 decides that the reference clock of the microcomputer 20 is being output (i.e. not suspended), "0" is written into each bit corresponding to the period T2, namely, the sixth bit through the eighth bit, of the clock information register section 17. Also, the output data ND acquired from the microcomputer 20 are written into the 0th word through the second word of the data bank section 12.

In a period T3, when the clock operation discrimination section 15 decides that the reference clock of the microcomputer 20 has been suspended, "1" is written into each bit corresponding to the period T3, namely, the ninth bit through the A-th bit, of the clock information register section 17, and no data is written into the data bank section 12. Thereafter, in a period T4, when the clock operation discrimination section 15 decides that the reference clock of the microcomputer 20 is being output, "0" is written into each bit corresponding to the period T4, namely, the B-th bit through the F-th bit, of the clock information register section 17. Also, the output data ND acquired from the microcomputer 20 are written into the third word through the seventh word of the data bank section 12.

As described above, to the clock information register section 17, the write operation is performed at every sampling interval. Meanwhile, to the data bank section 12, only when the reference clock of the microcomputer 20 is being output, the write operation is performed on a basis of each sampling interval. Namely, as shown in FIG. 3A, if the reference clock of the microcomputer 20 is suspended after data is written into the second word of the data bank section 12, a write pointer for the data bank section 12 is suspended, and when the output of the reference clock of the microcomputer 20 is resumed, data is written into the third word of the data bank section 12, following the second word.

On completion of the entire data write into the clock information register section 17, the values of the clock information register section 17 and the data bank section 12 are read out and analyzed. By this, as shown in FIG. 3B, it can be understood that the reference clock from the microcomputer 20 is suspended for six sampling periods (period T1), and thereafter, due to the restoration of clock operation, data are acquired for three sampling periods (period T2), and thereafter, the reference clock is suspended again for two sampling periods (period T3), and thereafter, the data are sampled for five sampling periods (period T4) due to the restoration of clock operation. Here, since the bit structure of the clock information register section 17 and the word structure of the data bank section 12 are correspondingly the same in number, it can be known that the eighth and subsequent words of the data bank section 12 include old data having been sampled before.

As such, by means of analysis by referring to the values stored in the clock information register section 17, the reference clock suspension point and the reference clock suspension period of the microcomputer 20 can easily be discriminated.

Figure 4:
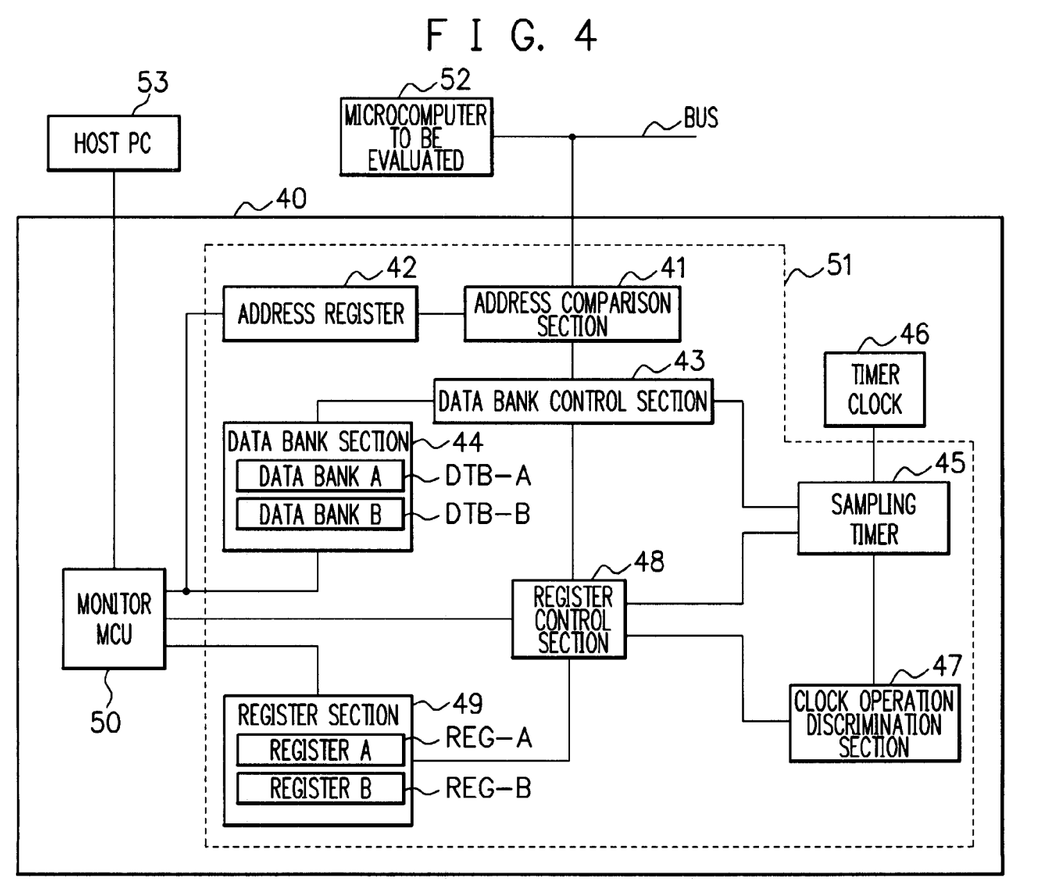
FIG. 4 is a diagram showing a typical configuration example of the debugging system according to the embodiment of the present invention.

FIG. 4 is a block diagram showing a typical configuration example of a debugging system according to the embodiment of the present invention.

In FIG. 4, a reference numeral 40 is an in-circuit emulator (ICE), which is constituted including a monitoring unit corresponding to the monitoring unit 10 shown in FIG. 1. Also, a reference numeral 52 is a microcomputer to be evaluated, capable of executing a program related to debugging, and a reference numeral 53 is a host PC, which respectively correspond to the microcomputer 20 and the host PC 30 shown in FIG. 1. The debugging system shown in FIG. 4 monitors an access state to a certain data address by monitoring a signal on an external trace bus BUS being output from the microcomputer 52. The data output from the microcomputer 52 via the external trace bus BUS are defined as trace data, and corresponding to a variety of data accesses from the microcomputer 52, an address to be accessed and either a read data or a write data are output as trace data.

The ICE 40 includes an address comparison section 41, an address register 42, a data bank control section 43, a data bank section 44, a sampling timer 45, a timer clock 46, a clock operation discrimination section 47, a register control section 48, a clock information register section 49 and a monitor MCU 50. The address comparison section 41, the address register 42, the data bank control section 43, the data bank section 44, the sampling timer 45, the clock operation discrimination section 47, the register control section 48 and the clock information register section 49 can be configured of a programmable device 51, such as an FPGA, as an example.

The data bank control section 43, the data bank section 44, the sampling timer 45, the timer clock 46, the clock operation discrimination section 47, the register control section 48, the clock information register section 49 and the monitor MCU 50 respectively correspond to the data bank control section 11, the data bank section 12, the sampling timer 13, the timer clock 14, the clock operation discrimination section 15, the register control section 16, the clock information register section 17 and the monitor MCU 18 shown in FIG. 1.

However, in the example shown in FIG. 4, the data bank section 44 includes two data banks DTB-A, DTB-B, and also the clock information register section 49 includes two clock information registers REG-A, REG-B. Here, the data bank DTB-A and the clock information register REG-A are paired as one set, and also the data bank DTB-B and the clock information register REG-B are paired as another set. In the following description, it is assumed that each clock information register REG-A, REG-B has a 16-bit structure, and that each data bank DTB-A, DTB-B is configured of a ring buffer capable of storing 16-word data.

The address comparison section 41 compares an address value to be measured, which is set in the address register 42, with an address related to a trace data being output from the microcomputer 52 via the trace bus BUS, so as to extract the trace data related to the access to the address to be measured. Additionally, the data address to be measured set into the address register 42 is settable from the host PC 53 via the monitor MCU 50.

When the address comparison section 41 extracts the trace data related to the access to the address to be measured, the data bank control section 43 retains the read data or the write data. Further, in response to a sampling request signal supplied from the sampling timer 45, the data bank control section 43 writes the retained data into the data bank DTB-A or DTB-B in the data bank section 44. Additionally, when the trace data related to the access to the address to be measured having been set in the address register 42 are extracted for a plurality of times before the sampling request signal is output, the data bank control section 43 writes into the data bank DTB-A or DTB-B the read data or the write data in the trace data having been extracted most recently. Also, as will be described later, the switchover of the data banks DTB-A, DTB-B to which the data bank control section 43 writes data is performed under the control of the register control section 48.

The sampling timer 45 performs count operation related to the sampling intervals, using the clocks from the timer clock 46. When the count reaches predetermined sampling intervals, the sampling timer 45 outputs a sampling request signal to the data bank control section 43. On completion of writing the write data or the read data into the data bank DTB-A or DTB-B, the data bank control section 43 suspends (negates) the output of the sampling request signal. Here, it is possible to set the number of the sampling intervals to an arbitrary value depending on the hardware configuration. Or, it may also be possible to set to an arbitrary value from the host PC 53 via the monitor MCU 50, depending on the hardware configuration.

The sampling request signal supplied from the sampling timer 45 is also output to the clock operation discrimination section 47. After the sampling request signal is output, the clock operation discrimination section 47 measures the time duration up to when the output is suspended (from the asserted time to the negated time). As a result, if the sampling request signal is not negated for a certain period, the clock operation discrimination section 47 decides that the reference clock of the microcomputer 52 has been suspended, and notifies the register control section 48 of the suspension of the reference clock by means of outputting a clock suspension signal, or the like means.

In response to the sampling request signal output from the sampling timer 45, the register control section 48 writes information indicating the operating state of the clock into the clock information register REG-A or REG-B, based on the notification from the clock operation discrimination section 47. For example, when the notification indicating the suspension of the reference clock is received from the clock operation discrimination section 47, the register control section 48 writes "1" into the clock information register REG-A or REG-B. Meanwhile, when the notification indicating the suspension of the reference clock is not received (namely, the reference clock is being output), the register control section 48 writes "0" into the clock information register REG-A or REG-B. In other words, the register control section 48 is operated using the timer clock 46 as reference clock, and each time the sampling period elapses, the register control section 48 inevitably writes either data "0" or "1", depending on the operating state of the clock, into the clock information register REG-A or REG-B.

The clock information register section 49 is aimed to indicate the state of the reference clock of the microcomputer 52, having two clock information registers REG-A, REG-B. The clock information registers REG-A, REG-B correspond to the data banks DTB-A, DTB-B. For example, assuming that the number of words of the read/write data storable in each data bank is n word, each clock information register is constituted of n bits (where, n is an arbitrary integer, and in the present embodiment, n=16 as described above).

In regard to the data write into the clock information registers REG-A, REG-B, on completion of writing entire data into one of the clock information registers REG-A, REG-B, the succeeding data write is performed to the other clock information register REG-B, REG-A. Also, on completion of writing the entire data into the clock information register REG-A or REG-B, the register control section 48 outputs an interruption request signal to the monitor MCU 50. Further, at the same time, the register control section 48 outputs a signal to the data bank control section 43 instructing to switch over the data bank, to which the sampled data is to be written, from the data bank DTB-A or DTB-B to the data bank DTB-B or DTB-A. When a data is written into the clock information register REG-A, the corresponding sampled data is controlled to be written into the data bank DTB-A, while when a data is written into the clock information register REG-B, the corresponding sampled data is controlled to be written into the data bank DTB-B.

On receipt of the interruption request signal from the register control section 48, the monitor MCU 50 completely reads out a pair of data stored in either the clock information register REG-A and the data bank DTB-A or the clock information register REG-B and the data bank DTB-B, and uploads the readout data to the host PC 53. Here, in the above description, the register control section 48 notifies monitor MCU 50 of the completion of data write into the clock information register REG-A or REG-B by means of an interruption request signal. However, it is not limited thereto, but is also controllable by means of polling processing from the monitor MCU 50.

The host PC 53 preserves the data uploaded from the monitor MCU 50 in a storage area, for example, an internal hard disk provided in the host PC 53. As such, when the internal hard disk of the host PC 53 is used as data preservation area, the measurable time of the system is determined according to the vacant capacity of the hard disk. In regard to the monitored data stored in the host PC 53, an analysis processing is performed. Through the analysis, the reference clock suspension point and the reference clock suspension period are calculated.

Figure 5:
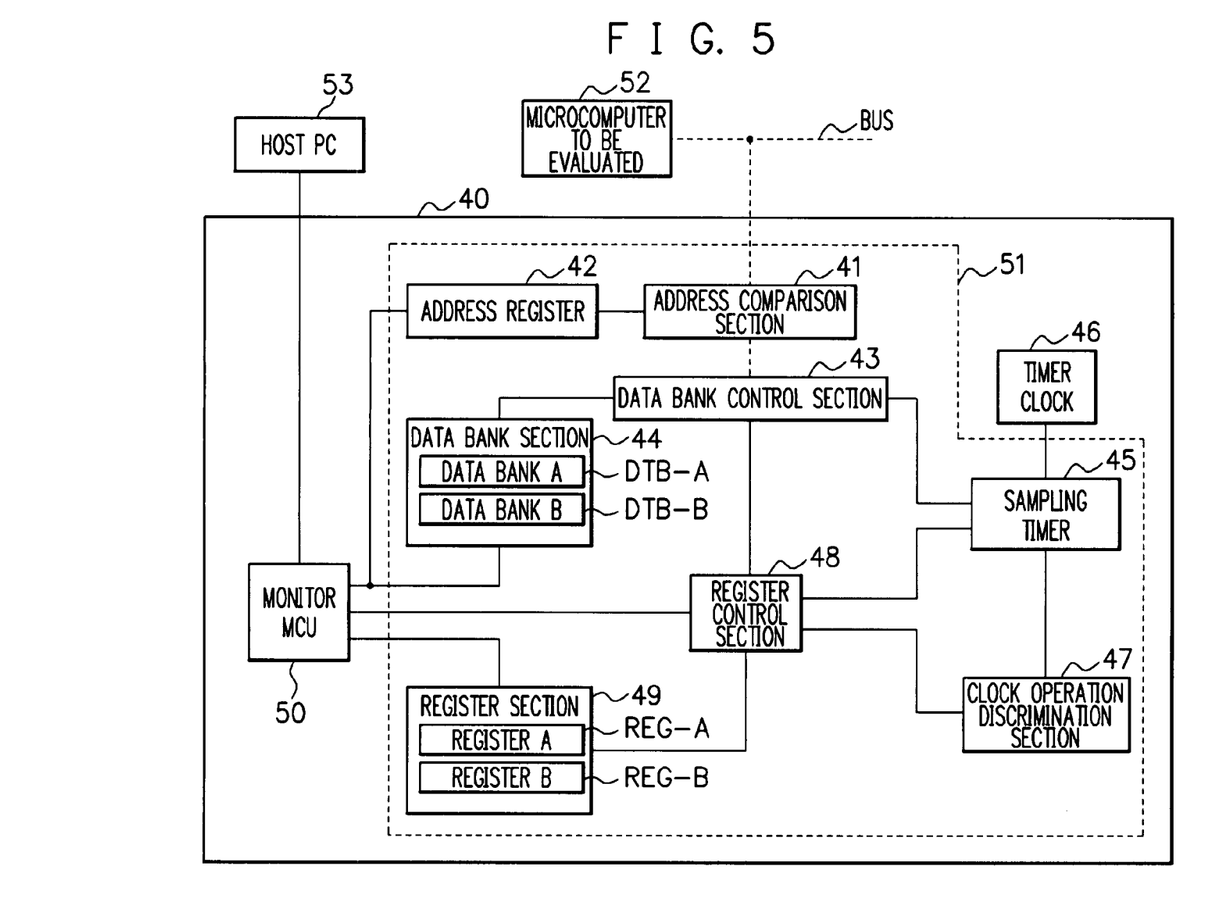
FIG. 5 is a diagram showing a suspension state of a reference clock in the debugging system shown in FIG. 4.

Here, the data bank control section 43 performs data write into the data bank DTB-A or DTB-B according to the sampling request signal from the sampling timer 45, using the reference clock supplied from the microcomputer 52. Therefore, in the event of the reference clock suspension of the microcomputer 52, there is neither output of the trace data nor the reference clock from the microcomputer 52, as shown in FIG. 5. As a result, even if a sampling request signal is output from the sampling timer 45, data write into the data bank DTB-A or DTB-B is not performed.

Further, when the reference clock output from the microcomputer 52 is resumed, the data bank control section 43 writes data subsequently to the data having been sampled before the suspension of the reference clock. Accordingly, without any data indicating the reference clock suspension point, it is neither possible to discriminate, in the data written into the data bank DTB-A, DTB-B, up to which data are the data having been written before the suspension of the reference clock, nor to discriminate from which data are the data written after the reference clock is restored. Therefore, according to the present embodiment, to cope with the above problem, the reference clock suspension point and the reference clock suspension period are calculated based on the values stored in the clock information register REG-A, REG-B, as described below in detail.

Hereinafter, referring to FIGS. 6A through 6D, there is described a method for measuring the reference clock suspension point and the reference clock suspension period, based on the data stored in the clock information registers REG-A, REG-B and the data banks DTB-A, DTB-B. Here, in the following, an example of data write in four events, events A through D, will be described. The event A corresponds to the case of the reference clock of the microcomputer 52 being not suspended, and the event B corresponds to the case of the reference clock of the microcomputer 52 being suspended. Also, the event C corresponds to the case that the reference clock of the microcomputer 52 continues to be suspended, and the event D corresponds to the case that the reference clock operation of the microcomputer 52 having been suspended is resumed.

Figure 6A:
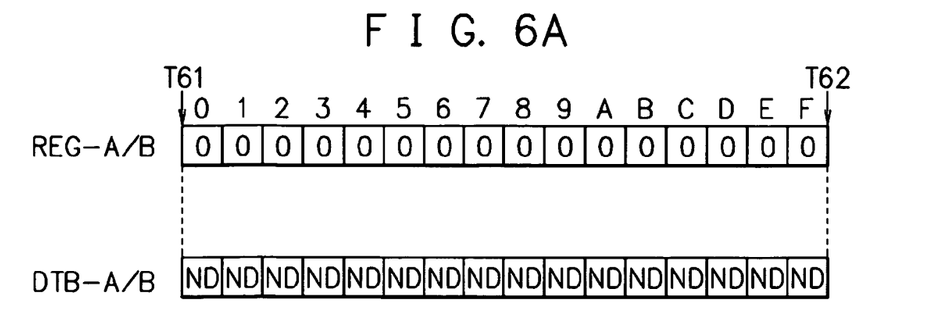
FIGS. 6A, 6B, 6C and 6D are diagrams for explaining a measurement method of a reference clock suspension point and a reference clock suspension period, using a clock information register and a data bank.

(Event A) The case of the reference clock not suspended during writing the entire data into the clock information register REG-A or REG-B (refer to FIG. 6A).

When the reference clock of the microcomputer 52 is not suspended over the period of times T61 to T62 corresponding to the 0th bit through the F-th bit in the clock information register REG-A or REG-B, each bit value of the clock information register REG-A or REG-B is "0" without exception. Therefore, it can be discriminated that new data ND are written into the entire corresponding data bank DTB-A or DTB-B. Also, since the sampling intervals are constant at all times, when values are entirely written into the clock information register REG-A or REG-B, (sampling period×16) is obtained as a measurement time.

Figure 6B:
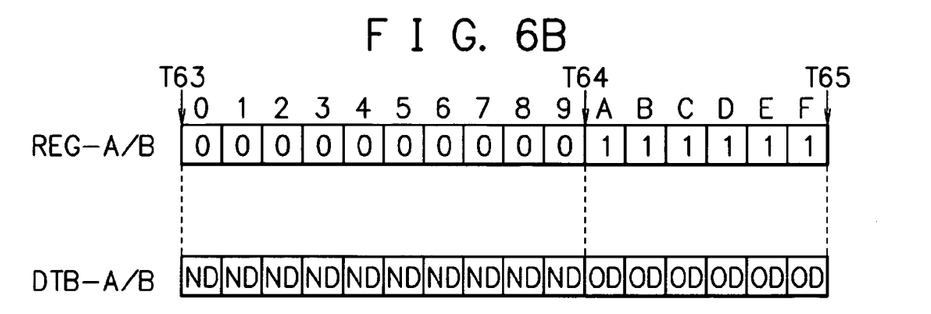

(Event B) The case of the reference clock being suspended before writing the entire data into the clock information register REG-A or REG-B is completed (refer to FIG. 6B).

When the reference clock of the microcomputer 52 becomes suspended before the completion of writing the entire data into the clock information register REG-A or REG-B, in the clock information register REG-A or REG-B, "0" is stored in each bit from the top (0th bit) to a middle bit, and "1" is stored in each succeeding bit.

In the example shown in FIG. 6B, it is understood that the reference clock of the microcomputer 52 became suspended at a time T64, i.e. ten (10) sampling periods after a time T63 in which a switchover to either the clock information register REG-A or REG-B was carried out, and thereafter, it comes to a time T65 in which data write into the clock information register REG-A or REG-B is entirely completed, while the reference clock remains intact in the suspended state. Because of the suspension of the reference clock of the microcomputer 52, when the entire data stored into the data bank DTB-A or DTB-B are read out, it can be discriminated that the values in the 0th word through the ninth word are new data ND which are newly sampled, and that the values in the A-th word through the F-th word are old data OD which are not newly sampled. In addition, the old data OD can be discarded because the data have already been read out.

In the example shown in FIG. 6B, because "1" is stored in each of the six bits, i.e. the A-th bit through the F-th bit, of the clock information register REG-A or REG-B, the reference clock suspension period can be calculated by (sampling period×6).

Figure 6C:
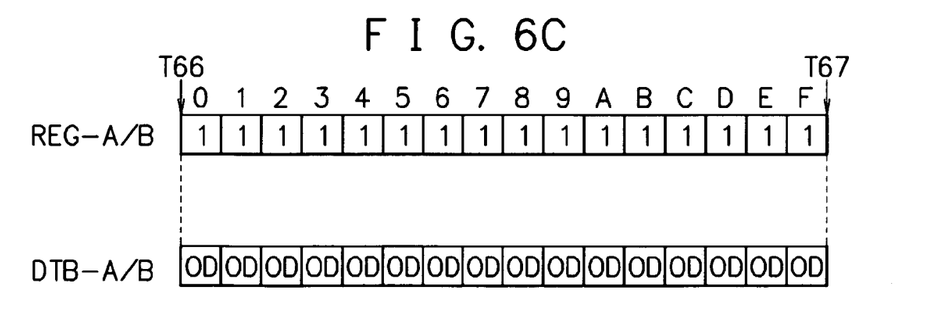

(Event C) The case of the reference clock suspension being continued over a period in which the entire data are written into the clock information register REG-A or REG-B (refer to FIG. 6C).

When the suspension of the reference clock of the microcomputer 52 continues over a period from a time T66 to a time T67, which corresponds to the 0th bit through the F-th bit, a value "1" is stored in each bit of the clock information register REG-A or REG-B. Accordingly, it is understood that the data stored in the corresponding data bank DTB-A or DTB-B are not updated even once, and that the entire data are old data OD. The old data OD can also be discarded.

In the above case, since a value "1" is stored in each bit of the clock information register REG-A or REG-B, the reference clock suspension period can be calculated by (sampling period×16).

Figure 6D:
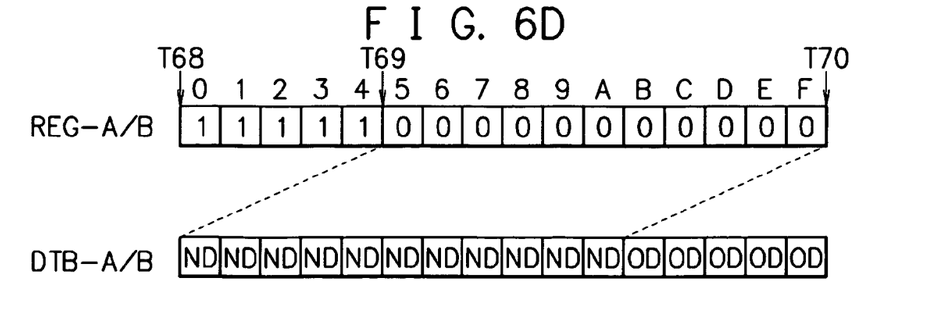

(Event D) The case that the reference clock operation having been suspended is resumed before the completion of writing the entire data into the clock information register REG-A or REG-B (refer to FIG. 6D).

When the reference clock of the microcomputer 52 having been suspended is restored before the completion of writing the entire data into the clock information register REG-A or REG-B, a value "1" is stored in each bit from the top (0th bit) to a middle bit of the clock information register REG-A or REG-B, whereas a value "0" is stored in each succeeding bit. By this, the restoration of the reference clock operation can be discriminated.

In the example shown in FIG. 6D, the reference clock of the microcomputer 52 is restored at a time T69, i.e. five (5) sampling periods after a time T68 in which a switchover to either the clock information register REG-A or REG-B was carried out, and thereafter, it comes to a time T70 in which data write into the clock information register REG-A or REG-B is entirely completed. Thus, it is understood that the data sampling has been performed for eleven (11) times. Further, after the restoration of the reference clock, the sampled data is written from the top of the data bank DTB-A or DTB-B. Therefore, in the example shown in FIG. 6D, it can be discriminated that the values stored in the 0th word through the A-th word of the data bank DTB-A or DTB-B are new data ND which have newly been written. In the example shown in FIG. 6D, because "1" is stored in each of the five bits, i.e. the 0th bit through the fourth bit, of the clock information register REG-A or REG-B, the reference clock suspension period can be calculated by (sampling period×5).

Additionally, in the clock information register REG-A or REG-B, even when the reference clock output and the suspension of the reference clock output are repeated before the entire data are written, in the data bank, data write after the restart is performed succeedingly to the data before the suspension of the reference clock, so as to perform similar operation.

According to the present embodiment, the operating state of the reference clock is written into the clock information register REG-A or REG-B at each sampling interval. Then, using the aforementioned analysis method after reading out the written data, it is possible to identify the reference clock suspension point and calculate the reference clock suspension period.

Next, analysis processing operation using the data stored in the clock information register REG-A, REG-B and the data bank DTB-A, DTB-B will be described below. Additionally, the analysis processing operation described in the following is executed in the monitor MCU 50, the CPU of the host PC 53, etc. (for the convenience of explanation, the above processing unit will be referred to as "analysis processing control section").

Figure 7:
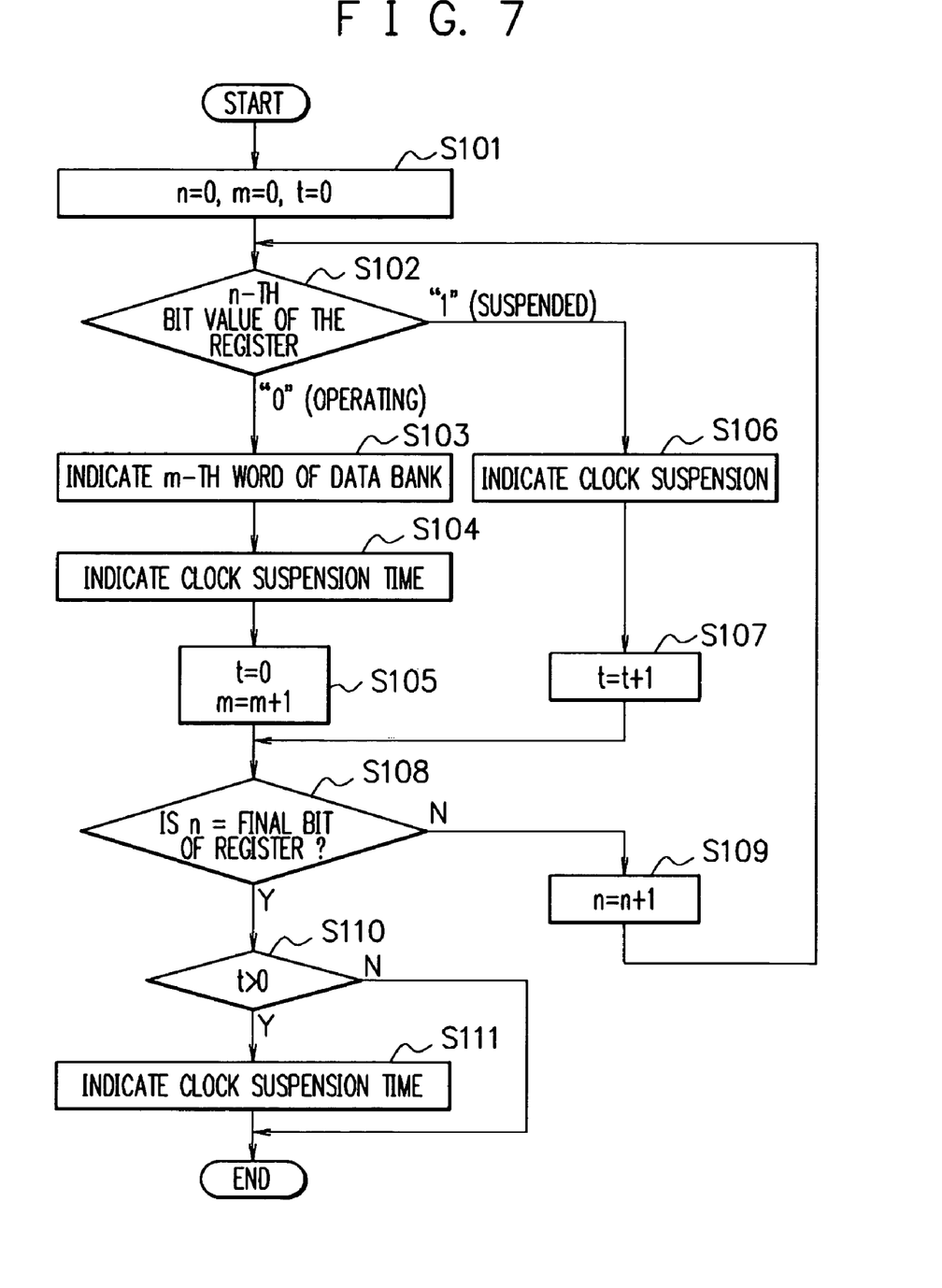
FIG. 7 is a flowchart showing a flow of first analysis processing operation according to the present embodiment.

FIG. 7 is a flowchart showing a flow of first analysis processing operation according to the present embodiment. In the first analysis processing shown in FIG. 7, the suspension point and the suspension period of the reference clock are analyzed and displayed, based on the data stored in the clock information register REG-A, REG-B and the data bank DTB-A, DTB-B.

First, in step S101, the analysis processing control section initializes to "0" a read pointer n of the clock information register REG-A or REG-B, a read pointer m of the data bank DTB-A or DTB-B, and a reference clock suspension time value t, respectively. Next, in step S102, the analysis processing control section decides whether the value of the n-th bit of the clock information register REG-A or REG-B is "0" or "1".

As a result of the decision, in case the n-th bit value is "0", namely, in case the reference clock of the microcomputer is being output (in operation), then in step S103, the analysis processing control section controls to display the m-th word of the data bank DTB-A or DTB-B. In the subsequent step S104, the analysis processing control section controls to display the reference clock suspension time value t at that time, as a clock suspension period. Then, in step S105, the analysis processing control section initializes the reference clock suspension time value t to "0", and increments the value of the read pointer m by 1, and proceeds to step S108.

Meanwhile, as a result of the decision in step S102, in case the n-th bit value is "1", namely, in case the reference clock of the microcomputer is suspended, then in step S106, the analysis processing control section controls to display that the reference clock is suspended. Thereafter, in step S107, the analysis processing control section increments the reference clock suspension time value t by 1, and proceeds to step S108.

In step S108, the analysis processing control section decides whether or not the value of the read pointer n is identical to the value indicating the final bit of the clock information register REG-A or REG-B. As a result, in case the value of the read pointer n is different from the value indicating the final bit, then in step S109, the analysis processing control section increments the value of the read pointer n by 1, and returns to step S102.

Meanwhile, as a result of the decision in step S108, in case the value of the read pointer n is identical to the value indicating the final bit, then, in step S110, the analysis processing control section decides whether or not the reference clock suspension time value t is "0". As a result, in case the reference clock suspension time value t is not "0", then in step S111, the analysis processing control section controls to display the reference clock suspension time value t as a clock suspension period, and thereafter the processing is terminated. Meanwhile, as a result of the decision in step S110, in case the reference clock suspension time value t is "0", the processing is terminated.

Figure 8A:
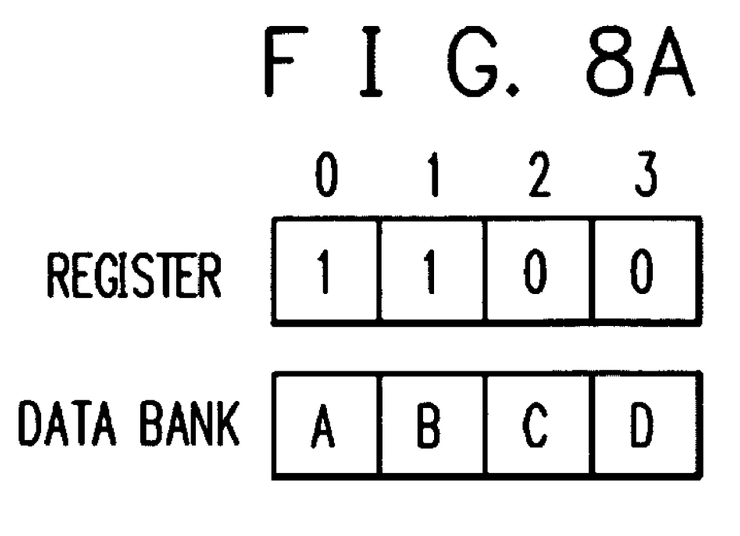
FIGS. 8A and 8B are diagrams for explaining a display example of the result of the first analysis processing.

For example, as shown in FIG. 8A, it is assumed that the clock information register has four (4) bits, and "1" is stored in the 0th bit and the first bit thereof, while "0" is stored in the second bit and the third bit thereof. Also, it is assumed that, in the data bank corresponding to the above clock information register, there are stored a value A in the 0th word, a value B in the first word, a value C in the second word, and a value D in the third bit, respectively.

Figure 8B:
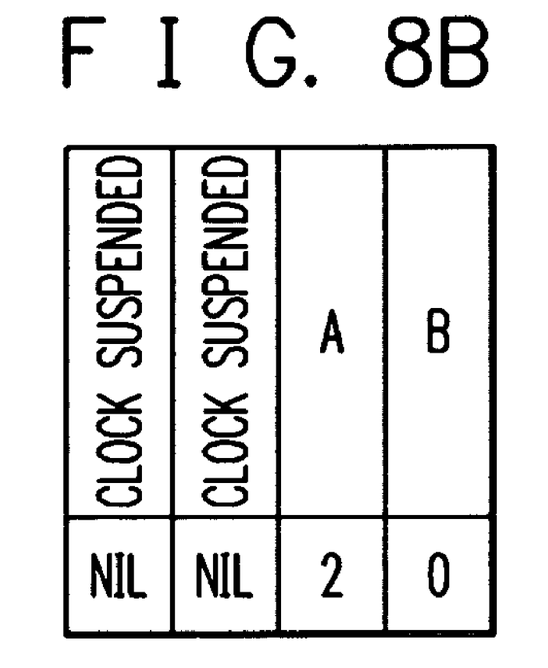

When analysis processing shown in FIG. 7 is performed using the data in the clock information register and the data bank shown in FIG. 8A, such an indication as shown in FIG. 8B is displayed. Namely, because each value of the clock information register is "1" for the first two sampling periods, "clock suspension" is displayed. In regard to the two sampling periods thereafter, because each value of the clock information register is "0", the data values A, B sampled at the sampling periods concerned are displayed, and also the reference clock suspension period is displayed together. By displaying in such a manner as shown in FIG. 8B, it is possible to easily recognize that the suspension of the reference clock for two sampling periods has occurred, as well as the reference clock suspension point.

Figure 9:
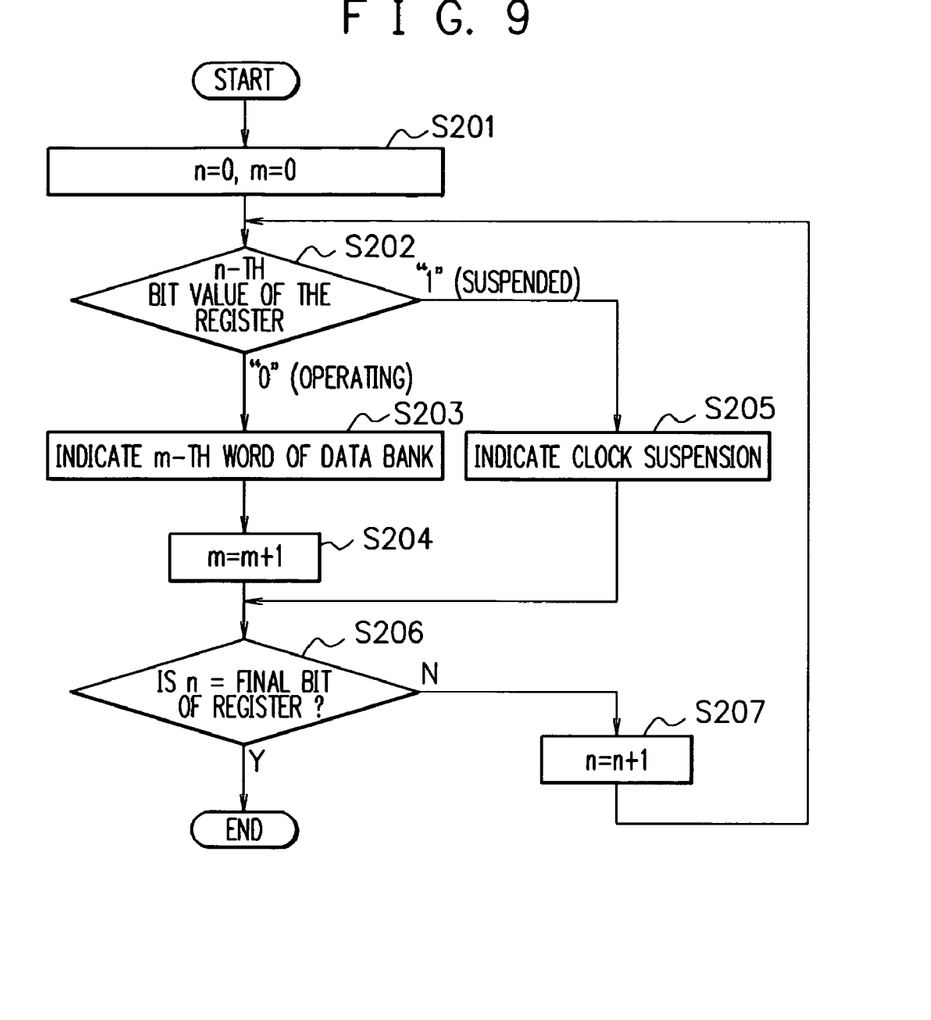
FIG. 9 is a flowchart showing a flow of second analysis processing operation according to the present embodiment.

FIG. 9 is a flowchart showing a flow of second analysis processing operation according to the present embodiment. In the second analysis processing shown in FIG. 9, the suspension point and the suspension period of the reference clock are analyzed on the basis of the data stored in the clock information register REG-A, REG-B, and the data bank DTB-A, DTB-B, and the reference clock suspension point is specifically indicated.

First, in step S201, the analysis processing control section initializes the read pointer n of the clock information register REG-A or REG-B and the read pointer m of the data bank DTB-A or DTB-B. Next, in step S202, the analysis processing control section decides whether the value of the n-th bit of the clock information register REG-A or REG-B is "0" or "1".

As a result of the decision, in case the value of the n-th bit is "0", then in step S203, the analysis processing control section controls to display the m-th word of the data bank DTB-A or DTB-B. Thereafter, in step S204, the analysis processing control section increments the value of the read pointer m by 1, and proceeds to step S206. On the other hand, as a result of the decision in step S202, in case the value of the n-th bit is "1", then in step S205, the analysis processing control section controls to display an indication of the reference clock being suspended, and proceeds to step S206.

In step S206, the analysis processing control section decides whether or not the value of the read pointer n is identical to the value indicating the final bit of the clock information register REG-A or REG-B. As a result, in case the value of the read pointer n is different from the value indicating the final bit, then, in step S207, the analysis processing control section increments the value of the read pointer n by 1, and returns to step S202. Meanwhile, in case the value of the read pointer n is identical to the value indicating the final bit, the processing is terminated.

Figure 10:
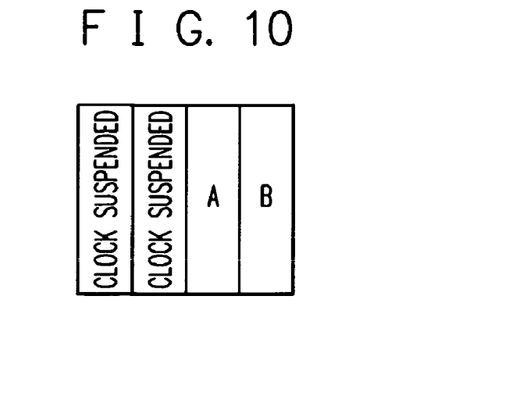
FIG. 10 is a diagram showing a display example of the result of the second analysis processing.

When analysis processing shown in FIG. 9 is performed using the data stored in the clock information register and the data bank shown in FIG. 8A, such an indication as shown in FIG. 10 is displayed. Namely, either an indication of "clock suspension" or the sampled data values are displayed. By this, since the reference clock suspension period is not acquired and preserved in the result, it becomes possible to reduce a data amount in regard to the analysis result, enabling easy recognition of the reference clock suspension point. Additionally, in regard to the reference clock suspension period, it is possible to obtain from the count of the "clock suspension" displayed.

Figure 11:
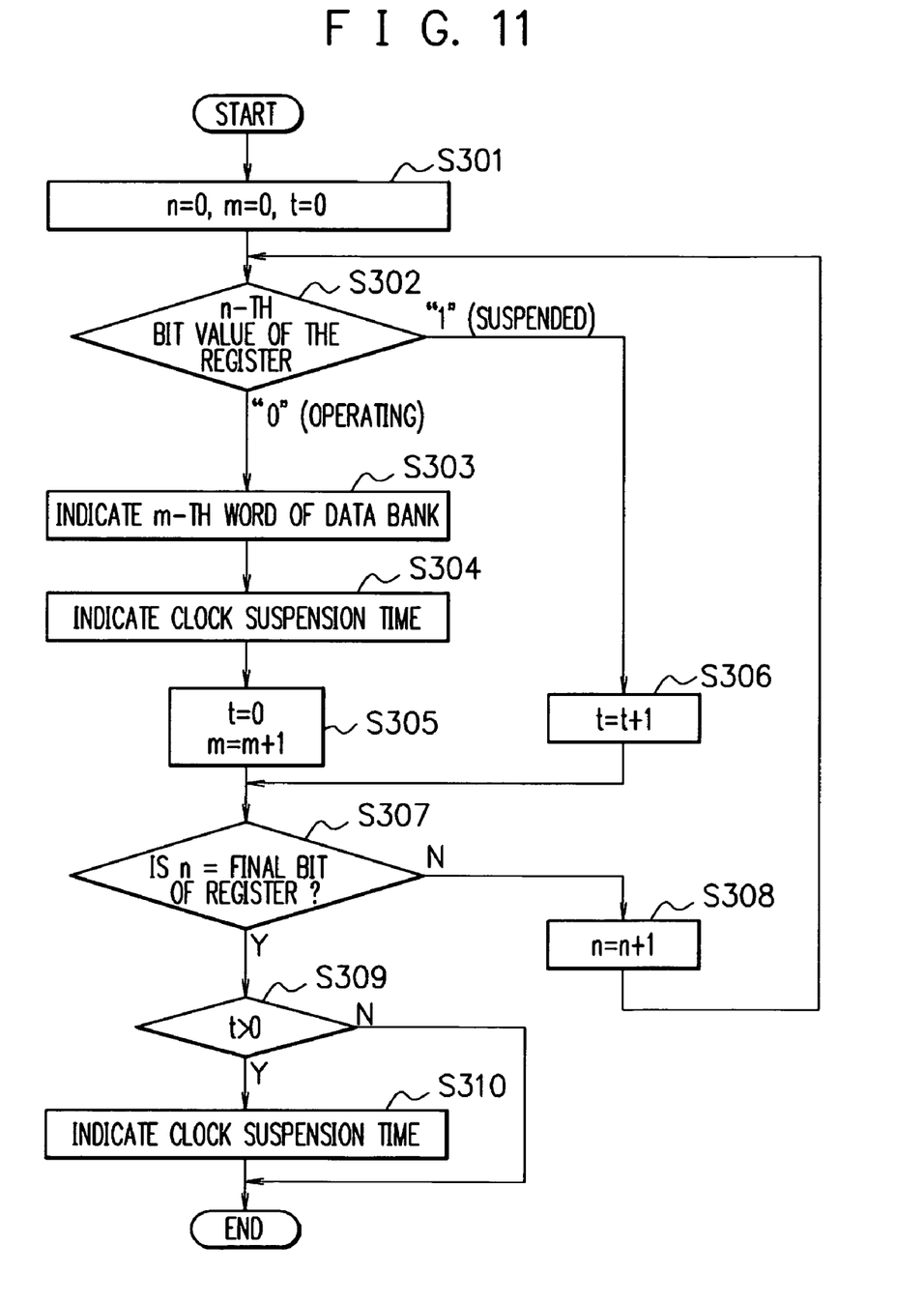
FIG. 11 is a flowchart showing a flow of third analysis processing operation according to the present embodiment.

FIG. 11 is a flowchart showing a flow of third analysis processing operation according to the present embodiment. In the third analysis processing shown in FIG. 11, the suspension point and the suspension period of the reference clock are analyzed on the basis of the data stored in the clock information register REG-A, REG-B, and the data bank DTB-A, DTB-B, and the reference clock suspension period is specifically indicated.

Here, as compared with the first analysis processing shown in FIG. 7, the third analysis processing shown in FIG. 11 differs in that when the clock is suspended, no indication is displayed to that effect. Since processing in the other steps is the same, description thereof is omitted. Additionally, steps S301 to S305 and steps S306 to S310 in the third analysis processing shown in FIG. 11 correspond to the steps S101 to S105 and the steps S107 to S111 in the first analysis processing shown in FIG. 7, respectively.

Figure 12:
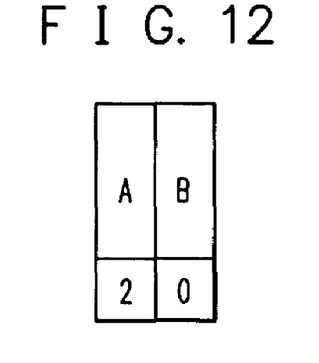
FIG. 12 is a diagram showing a display example of the result of the third analysis processing.

When the third analysis processing shown in FIG. 11 is performed using the data stored in the clock information register and the data bank shown in FIG. 8A, such an indication as shown in FIG. 12 is displayed. By this, it is possible to recognize that the suspension of the reference clock has occurred in two sampling periods immediately before the data value A is acquired. Furthermore, resultantly, it becomes possible to further reduce the data amount in regard to the analysis result, because the information indicating the suspension period of the reference clock may be preserved, instead of preserving information whether or not the reference clock has suspended on a basis of each sampling period.

Now, the first to the third analysis processing described above may be performed using CPU or MPU, RAM, ROM, etc. of a computer, and can be realized by the operation of a program stored in the RAM and the ROM. The above program is included in an embodiment of the present invention. Also, the above analysis processing can be realized by recording a program, which is to be operated by a computer to realize the aforementioned functions, into a recording medium such as CD-ROM, and by loading the program into the computer. Accordingly, the recording medium having the above program recorded thereon is included in an embodiment of the present invention. As recording media for recording the above program, not only CD-ROM but flexible disk, hard disk, magnetic tape, magneto-optical disk, nonvolatile memory card, etc. may be used.

Further, a program product realizing the aforementioned functions by performing processing through program execution in a computer is included in an embodiment of the present invention. The above program product includes a program itself realizing the functions of the above embodiments, a computer in which the above program is loaded, a transmission unit capable of providing the above program to a computer which is connected communicably via a network, a network system having the transmission unit concerned, and so on.

Also, not only in the case of realizing the functions of the above embodiments by means of a computer which executes a program supplied thereto, but in the case of realizing the functions of the above embodiments by means of the above program under the cooperation of OS (operating system) being operated in a computer and/or other application software, the program concerned is included in an embodiment of the present invention. Also, in the case of realizing the functions shown in the above embodiments by means of a function expansion board or a function expansion unit of a computer in which the entire or a part of processing of the supplied program is executed, the program concerned is included in an embodiment of the present invention. Further, to utilize the present invention in a network environment, it may also be possible to configure the entire or a part of the program to be executable in another computer.

Figure 13:
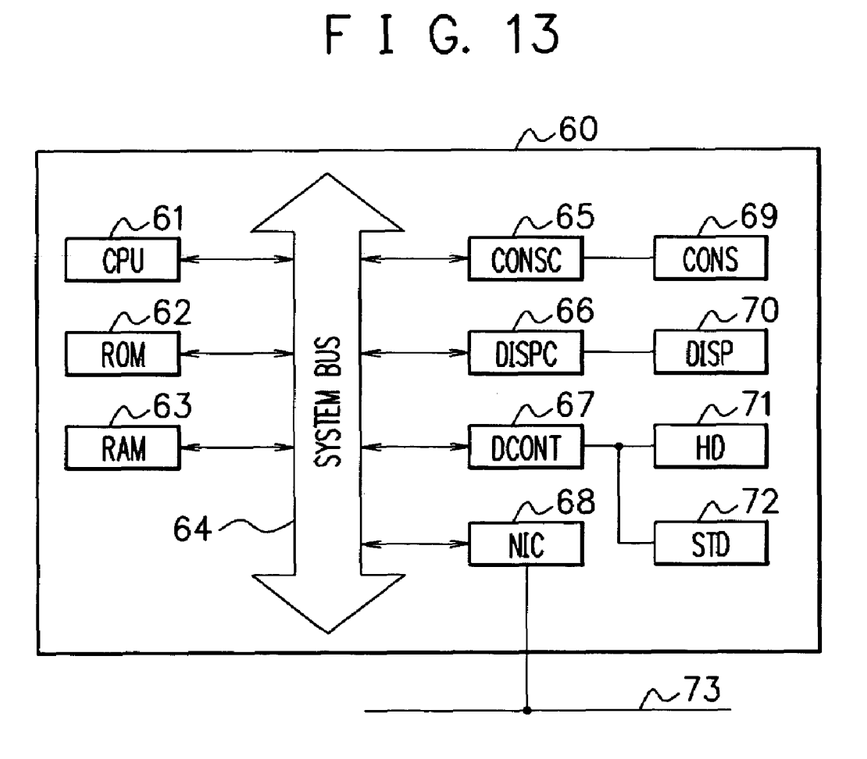
FIG. 13 is a diagram showing a configuration example of a computer capable of executing analysis processing operation.

For example, the first to the third analysis processing described above can realize by a computer function 60 shown in FIG. 13, which is one exemplary configuration of the host PC. By means of a CPU 61 provided therein, the operation in the above-mentioned embodiment is performed.

As shown in FIG. 13, the computer function 60 has a configuration including a CPU 61, a ROM 62, a RAM 63, a controller (CONSC) 65 of an operation section (CONS) 69, a display controller (DISPC) 66 of a display (DISP) 70, a controller (DCONT) 67 of a hard disk (HD) 71 and a storage device (STD) 72 such as a flexible disk, and a network interface card (NIC) 68, which are interconnected communicably via a system bus 64.

The CPU 61 integrally controls each configuration portion connected by the system bus 64 by executing software (program) stored in the ROM 62 or the HD 71 or software (program) supplied from the STD 72. Namely, the CPU 61 executes the processing program by reading out the processing program for performing the above-mentioned operation from the ROM 62, the HD 71 or the STD 72, and thereby the CPU 61 controls to realize the operation according to the embodiments described above. The RAM 63 functions as a main memory, a work area, or the like, of the CPU 61.

The CONSC 65 controls command inputs from the CONS 69, a non-illustrated pointing device, etc. The DISPC 66 controls to display on the DISP 70. The DCONT 67 performs access control to the HD 71 and the STD 72 for storing a boot program, a variety of applications, user files and a network management program, as well as the above-mentioned processing program according to the embodiment described above. The NIC 68 performs data exchange with other devices provided in the network 73 in a bidirectional manner.

Additionally, the above-mentioned analysis processing is executable not only in the host PC but in the monitor MCU. Further, it may also be possible that the analysis processing is executed in an analysis processing section which is newly provided in the monitoring unit, etc. for performing the analysis processing.

As having been described, according to the present embodiments, even when the reference clock from the microcomputer to be inspected is suspended, the suspension point, the recovering point and the suspension period can be measured easily, based on the data stored in the clock information register. For example, even when a target program executed in the microcomputer to be inspected includes a state of the reference clock suspension, such as a sleep mode and a stop mode, it becomes possible to perform debugging support by monitoring the data for the periods before and after the inserted reference clock suspension period.

In addition, in the above-mentioned embodiments, merely examples of the bit configuration of the clock information register and the data bank configuration are shown. The configurations are not limited thereto, but can be modified arbitrarily. Also, as to the data value written into the clock information register, the correspondence of the value to the state of the reference clock is arbitrary, as long as it is possible to recognize whether or not the reference clock is suspended.

Further, in the debugging system shown in FIG. 4, the case of providing two pairs of sets of the clock information registers and the data banks has been shown as an example. However, it may also be possible to provide three pairs, or more, of sets of the clock information registers and the data banks. As the number of pairs increases, the circuit loads can be reduced. Also, instead of providing the plurality of pairs of clock information registers and data banks, it may also be possible to provide only one pair, each divided into a plurality of areas, and to perform write and read of data, etc. thereto and therefrom.

According to the present invention, the operating state of a reference clock is discriminated at the sampling intervals of the output data by the use of output data from a processing circuit to be inspected, and the discrimination result is preserved in a register. Accordingly, based on the information preserved in the above register, it is possible to measure the suspension position and the suspension period of the reference clock easily.

The aforementioned embodiments show merely a few typical examples when implementing the present invention, and the technical scope of the present invention is not to be understood by the above examples in a restrictive manner. The present invention may be implemented in a variety of forms without deviating from the technical ideas of the present invention and the principal features thereof.

What is claimed is:

1. An inspection support apparatus comprising:
    a data acquisition section for acquiring output data being output from a processing circuit to be inspected, and for preserving the output data in a data bank, using a reference clock being output from said processing circuit together with the output data;
    an operation discrimination section for discriminating suspension of said reference clock at the sampling intervals of the output data; and
    a clock information register for preserving a discrimination result obtained by said operation destination section.

2. The inspection support apparatus according to claim 1, further comprising:
a sampling timer for generating a sampling request signal, a signal for instructing the acquisition of the output data being output from said processing circuit, being asserted each time the sampling interval of the output data elapses, and being negated subsequently after the output data is preserved in said data bank.

3. The inspection support apparatus according to claim 2, wherein, based on the sampling request signal, said operation discrimination section discriminates whether or not said reference clock is suspended.

4. The inspection support apparatus according to claim 3, wherein, when the sampling request signal is not negated after a certain time elapses following the assertion of the sampling request signal, said operation discrimination section discriminates that said reference clock is suspended.

5. The inspection support apparatus according to claim 1, wherein said data bank is comprised in correspondence to said clock information register, and the inspection support apparatus comprises a plurality of pairs of said data banks and said clock information registers.

6. The inspection support apparatus according to claim 5, wherein the number of output data preservable in said data bank is identical to the number of discrimination results in said operation discrimination section to be preserved in said clock information register.

7. The inspection support apparatus according to claim 5, wherein the plurality of pairs of said data banks and said clock information registers are used by being exclusively switched over.

8. The inspection support apparatus according to claim 5, wherein two pairs of said data banks and said clock information registers are comprised, and after the preservation of the entire discrimination results to one of said clock information register is completed in said operation discrimination section, a switchover is performed so as to preserve a subsequent discrimination result acquired in said operation discrimination section into said other clock information register.

9. The inspection support apparatus according to claim 1, further comprising an address register for setting an address to be measured, wherein said data acquisition section acquires an output data related to an access to the address being set in said address register, from among output data being output from said processing circuit.

10. The inspection support apparatus according to claim 1, further comprising a clock generation section for generating a clock different from said reference clock, wherein the preservation of the discrimination result in said operation discrimination section into said clock information register is performed using the clock generated in said clock generation section.

11. The inspection support apparatus according to claim 1, further comprising an analysis processing section for acquiring a suspension position and a suspension period of said reference clock, based on the information preserved in said clock information register.

12. An inspection support method comprising:
successively acquiring preserved information from a clock information register preserving, at the sampling intervals of output data, information related to the state of a reference clock being output from a processing circuit by an inspection support apparatus which acquires and preserves into a data bank, the output data being output from said processing circuit to be inspected, and
deciding whether or not said reference clock has been suspended.

13. The inspection support method according to claim 12, further comprising outputting a suspension position and a recovery position of said reference clock, based on the decision result of the suspension of said reference clock using the information preserved in said clock information register.

14. A computer program product comprising a computer readable medium having control logic stored therein for causing a computer to:
decide whether or not a reference clock has been suspended by successively acquiring preserved information from a clock information register preserving, at the sampling intervals of output data, information related to the operating state of a reference clock being output from a processing circuit by an inspection support apparatus which acquires and preserves into a data bank, the output data being output from the processing circuit to be inspected; and
calculate a suspension position and a recovery position of the reference clock, based on the decision result.

15. The computer program product according to claim 14, further comprising control logic for causing a computer to calculate a suspension period of the reference clock.

* * * * *